United States Patent [19]

Fukatsu et al.

[11] Patent Number: 4,680,607
[45] Date of Patent: Jul. 14, 1987

[54] PHOTOVOLTAIC CELL

[75] Inventors: Takeo Fukatsu; Masaru Takeuchi, both of Kyoto; Kazuyuki Goto, Osaka, all of Japan

[73] Assignee: Sanyo Electric Co., Ltd., Japan

[21] Appl. No.: 730,670

[22] Filed: May 3, 1985

[30] Foreign Application Priority Data

May 11, 1984 [JP] Japan ................................. 59-94915
Jun. 5, 1984 [JP] Japan ................................. 59-114842

[51] Int. Cl.$^4$ .................................................. H01L 27/14
[52] U.S. Cl. ............................................ 357/30; 357/2; 357/16; 357/58; 357/63
[58] Field of Search .................... 357/2, 16, 30, 58, 63

[56] References Cited

U.S. PATENT DOCUMENTS 4,623,907 11/1986 Okuda ..................................... 357/16

Primary Examiner—Wojciechowicz, Edward J.
Attorney, Agent, or Firm—Darby & Darby

[57] ABSTRACT

A photovoltaic cell in accordance with the present invention comprises a transparent substrate, a transparent first electrode layer on the substrate and a first semiconductor layer of P type on the first electrode layer, the first semiconductor layer being approximately 25 to 300 Å in thickness and having activation energy of less than 0.3 eV for generation of positive holes. The above stated cell further comprises a second semiconductor layer of the same conductivity type on the first semiconductor layer, the second semiconductor layer being approximately 100 to 1000 Å in thickness and having activation energy of more than 0.3 eV for generation of positive holes. The above stated cell further comprises a third semiconductor layer of I type on the second semiconductor layer, a fourth semiconductor layer of N type on the third semiconductor layer and a second electrode layer on the fourth semiconductor layer.

18 Claims, 14 Drawing Figures

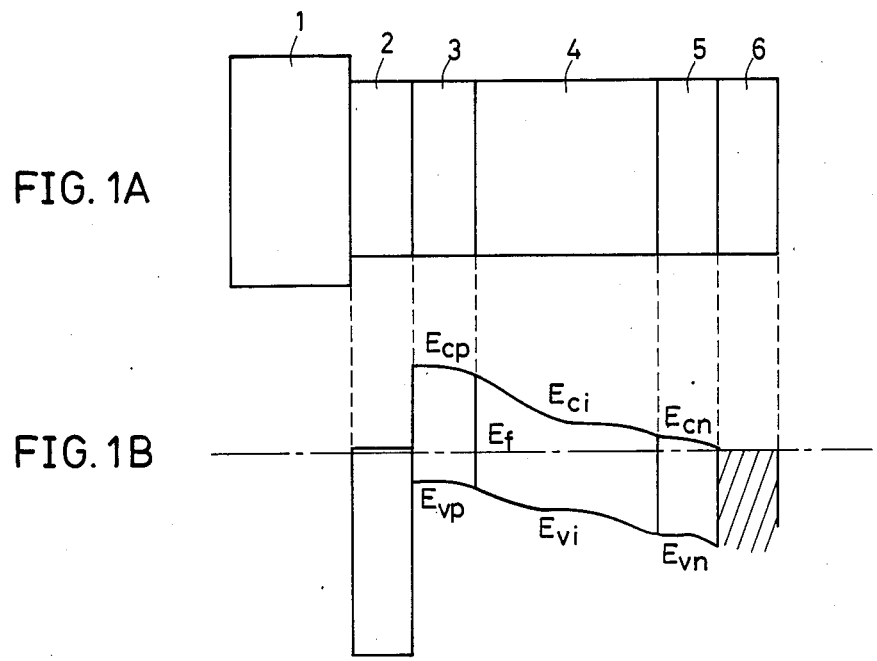
FIG. 1A
FIG. 1B
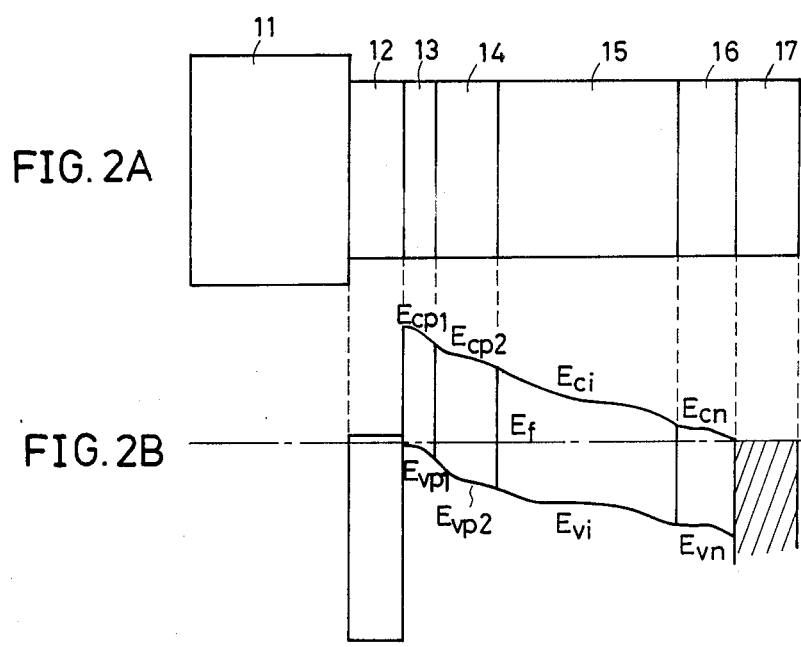
FIG. 2A
FIG. 2B 4,680,607

1

PHOTOVOLTAIC CELL

BACKGROUND OF THE INVENTION

1. Field of the Invention

The present invention relates to a photovoltaic cell for converting optical energy into electric energy and particularly relates to an improvement of the photoelectric conversion efficiency of a cell of PIN type.

2. Description of the Prior Art

Photovoltaic cells have been conventionally utilized for solar cells, photodetectors etc. and recently special interest has been shown toward photovoltaic cells using amorphous silicon (a-Si). The U.S. Pat. No. 4,064,521 issued to D. E. Carlson discloses a photovoltaic cell of PIN type using amorphous silicon.

FIG. 1A shows schematically a typical sectional structure of such a photovoltaic cell of PIN type. On a transparent insulating substrate 1, a transparent electrode layer 2, an amorphous silicon layer 3 of P type, an amorphous silicon layer 4 of I type, an amorphous silicon layer 5 of N type and a back surface electrode 6 are formed one upon another. FIG. 1B shows schematically an energy band profile corresponding to the cell shown in FIG. 1A. In FIG. 1B, the horizontal chained line $E_f$ represents the Fermi level. The regions $E_{cp}$, $E_{ci}$ and $E_{cn}$ on the upper winding line represent respectively lower limit levels of the conduction band in the amorphous silicon layers of P, I and N types. The regions $E_{vp}$, $E_{vi}$ and $E_{vn}$ on the lower winding line represent respectively upper limit levels of the valence band in the P, I and N layers.

In the photovoltaic cell shown in FIG. 1A, when light is applied through the transparent substrate 1 and the transparent electrode layer 2, pairs of electrons and positive holes in the free state are generated mainly within the layer of I type. These electrons and holes are collected into the back surface electrode layer 6 and the transparent electrode layer 2 respectively by an electric field as shown in FIG. 1B induced by PIN junction so that photovoltaic power is produced.

In order to obtain higher photovoltaic power, higher open-circuit voltage and higher short-circuit current of the cell are desired. The open-circuit voltage depends on potential difference caused by PIN junction and can be made high by increasing the doping amount in the layer of P type. However, according to the increase of the doping amount, the band gap $E_{cp}-E_{vp}$ is generally decreased, resulting in increase of the light absorbed in the P-type layer 3. However, many of the electrons excited within the P-type layer are recombined with major carrier of positive holes before being separated by the electric field by PIN junction and they contribute little to production of photovoltaic power. Thus, the light reaching the effective photoelectric conversion region 4 is decreased and as a result, output current is decreased.

In consequence, it is difficult to increase both the output voltage and the output current in a conventional photovoltaic cell and accordingly difficult to improve the efficiency of such a photovoltaic cell.

SUMMARY OF THE INVENTION

A primary object of the present invention is to provide a photovoltaic cell having a photoelectric conversion efficiency improved by increasing both open-circuit voltage and short-circuit current.

A photovoltaic cell in accordance with the present invention comprises a transparent substrate, a transparent first electrode layer on the substrate and a first semiconductor layer of a first conductive type on the first electrode layer, the first semiconductor layer being approximately 25 to 300 Å in thickness and having activation energy of less than 0.3 eV for generation of major carriers; the above stated cell further comprises a second semiconductor layer of the first conductive type on the first semiconductor layer, the second semiconductor layer being approximately 100 to 1000 Å in thickness and having activation energy of more than 0.3 eV for generation of major carriers; the above stated cell further comprises a third semiconductor layer of a second conductive type on the second semiconductor layer, a fourth semiconductor layer of a third conductive type on the third semiconductor layer and a second electrode layer on the fourth semiconductor layer.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1A shows schematically a sectional structure of a conventional photovoltaic cell;

FIG. 1B is a schematic illustration explaining an energy band profile in the photovoltaic cell shown in FIG. 1A;

FIG. 2A shows schematically a sectional structure of a photovoltaic cell in accordance with the present invention;

FIG. 2B is a schematic illustration explaining an energy band profile in the photovoltaic cell shown in FIG. 2A;

DESCRIPTION OF THE PREFERRED EMBODIMENTS

Figure 3:
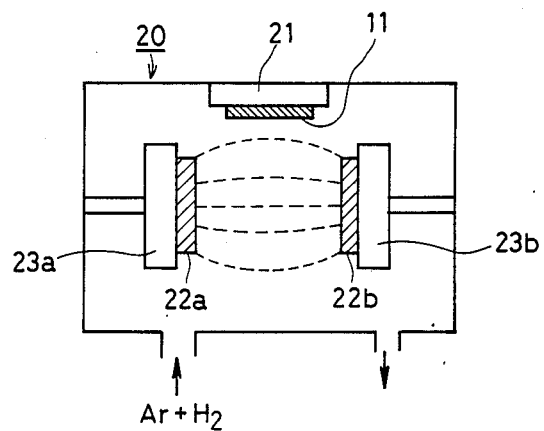
FIG. 3 is a schematic illustration explaining a sputtering device used in a manufacturing process of a photovoltaic cell in accordance with the present invention.

FIG. 2A shows schematically a sectional structure of a photovoltaic cell in accordance with an embodiment of the present invention. On a transparent insulating substrate 11, a transparent electrode layer 12, a first semiconductor layer 13 of P type, a second semiconductor layer 14 of the same conductivity type, an amorphous silicon layer 15 of I type, a semiconductor layer 16 of N type and a back surface electrode layer 17 are formed one upon another. FIG. 2B shows schematically an energy band profile corresponding to the cell shown in FIG. 2A. In the same manner as in FIG. 1B, the horizontal chained line $E_f$ represents the Fermi level; the regions $E_{cp1}$, $E_{cp2}$, $E_{ci}$ and $E_{cn}$ on the upper winding line represent respectively the lower limit levels of the conduction band of the semiconductor layers 13, 14, 15 and 16; and the regions $E_{vp1}$, $E_{vp2}$, $E_{vi}$ and $E_{vn}$ on the lower winding line represent respectively the upper limit levels of the valence band of the semiconductor layers 13, 14, 15 and 16.

As is understood from FIG. 2B, the activation energy $E_f - E_{vp1}$ for generating positive holes as major carriers within the first semiconductor layer 13 of P type is controlled to be a small value of less than 0.3 eV, which is smaller than $E_f - E_{vp}$ shown in FIG. 1B. As a result, the lower limit level $E_{cp1}$ of the conduction band is made high and a high internal electric field intensity is obtained in the photovoltaic cell. On the other side, since the thickness of the semiconductor layer 13 is controlled to have such an extremely small value as approximately 25 to 300 Å, there is little loss of light due to absorption in this layer. This semiconductor layer 13 is obtained by a sputtering process in which a film including microcrystalline silicon (μc-Si) containing P type impurity is formed, as described later.

The second semiconductor layer 14 of the same type as that of the semiconductor layer 13 is controlled to have the activation energy $E_f - E_{vp2}$ of more than 0.3 eV. More specifically, the number of positive holes as major carriers in the layer 14 is less than that in the layer 13. Accordingly, the electrons excited by absorption of light in the layer 14 are less frequently recombined with positive holes than in the layer 13 and as a result, they can make a contribution to photovoltaic power. The semiconductor layer 14 is made to have photoconductivity of more than $10^{-5} \Omega^{-1} cm^{-1}$ with irradiation of sunlight spectrum (AM-1) on the equator with 100 mW/cm² so that more contribution can be made to photovoltaic power. Such a semiconductor layer 14 is an amorphous semiconductor doped with impurity of P type, which can be formed by a plasma decomposition method as shown in the previously cited U.S. Pat. No. 4,064,521.

The amorphous semiconductor layer 15 of I type adjacent to the second layer 14 of P type is a practically intrinsic semiconductor. Amorphous silicon formed by plasma decomposition of silane gas not containing impurity gas is not intrinsic in the strict sense of the word but slightly has a conductivity of N type. Accordingly, the practically intrinsic semiconductor layer 15 is formed by plasma decomposition of silane gas (SiH₄, Si₂H₆ etc.) containing a extremely small amount of impurity gas of P type for the purpose of compensating such conductivity of N type.

The semiconductor layer 16 of N type adjacent to the I type layer 15 is formed of microcrystalline silicon or amorphous silicon containing microcrystalline silicon.

An example of a method of manufacturing a photovoltaic cell as shown in FIG. 2A will be described more specifically in the following.

First, a transparent electrode layer 12 made of a film of SnO₂, ITO or the like having a thickness of approximately 3000 Å is formed on the transparent substrate 11 by a well-known CVD method. The substrate 11 with the electrode layer 12 exposed is set in a sputtering device 20 as shown in FIG. 3. A holder 21 supporting the substrate contains a heater therein. Polycrystalline silicon targets 22a and 22b are held by a pair of opposed electrodes 23a and 23b. When radio-frequency (RF) electric power is supplied to these electrodes, excited ions collide with the targets 22a and 22b so that sputtered silicon atoms are uniformly deposited on the exposed transparent electrode layer 12. An example of such sputtering conditions is shown in Table 1.

TABLE 1

| Sputtering Conditions for μC-Si | |
|---|---|
| sputtering gas | H₂ + Ar = 40 m Torr (H₂/Ar = 10) |
| doping gas | B₂H₆ (0.2%) |
| temperature of substrate | 320° C. |
| RF power | 500 W |
| radio-frequency | 13.56 MHz |
| deposition rate | 1Å/sec |

A semiconductor film 13 formed under the conditions shown in Table 1 is made of microcrystalline silicon of P type having an activation energy $E_f - E_{vp1}$ of 0.03 eV. The thickness of the layer 13 is controlled preferably to be 25 to 300 Å by selecting the sputtering time. The activation energy $E_f - E_{vp1}$ can be controlled by selecting the hydrogen partial pressure of the sputtering gas or the RF power.

After the formation of the first semiconductor film 13 of P-type microcrystalline silicon, a second semiconductor film 14 of amorphous silicon of the same conductivity type is formed. This P-type amorphous silicon layer can be formed by a plasma decomposition method using a well known parallel plate type RF glow discharge device as shown in the previously cited U.S. Patent, the Japanese Patent Laying-Open No. 114387/1981 and the U.S. Pat. No. 4,492,605. The formation of this amorphous semiconductor layer 14 is controlled so that the layer 14 is approximately 100 to 1000 Å in thickness and has an activation energy of more than 0.3 eV, say, 0.7 eV and a photoconductivity more than of $10^{-5} \Omega^{-1} cm^{-1}$ with irradiation of the AM-1 light with 100 mW/cm². An example of conditions for deposition of such P-type amorphous silicon is shown in Table 2.

TABLE 2

| Plasma Reaction Conditions for a-Si | |
|---|---|
| main gas | SiH₄ (20 SCCM) |
| doping gas | B₂H₆ (100 ppm) |
| vacuum state | 0.2 Torr |
| temperature of substrate | 250° C. |
| RF power | 20 W |
| radio-frequency | 13.56 MHz |

TABLE 2-continued

| Plasma Reaction Conditions for a-Si | |
|---|---|
| deposition rate | 1Å/sec | where SCCM represents Standard Cubic Centimeter per Minute.

After the formation of the P-type amorphous silicon layer 14, the RF glow discharge chamber is temporarily evacuated, or the substrate 1 is moved into another adjacent chamber which is separated by an openable partition wall for the purpose of formation of I-type layers. Then, a practically intrinsic I-type amorphous semiconductor layer 15 is formed by plasma decomposition of silane gas containing an extremely small amount of P-type impurity gas. The plasma reaction conditions in this case are substantially the same as in Table 2 except that there is little doping gas contained and that the deposition rate is 2 Å/sec. The reaction time is controlled so that a film thickness of 5000 to 7000 Å is obtained.

Subsequently, a semiconductor layer 16 of N-type microcrystalline silicon having a thickness of approximately 300 to 600 Å is formed on the I-type amorphous semiconductor layer 15. This N-type microcrystalline silicon layer is also formed by plasma decomposition of silane gas. The reaction conditions in this case are similar to those in Table 2, except that doping gas is 2% $PH_3$, that RF power is increased to 100 W and that the amount of hydrogen gas as dilution gas is increased.

Finally, a well-known metallic electrode layer 17 is formed on the N-type layer 16 by a well-known method.

Figure 4:
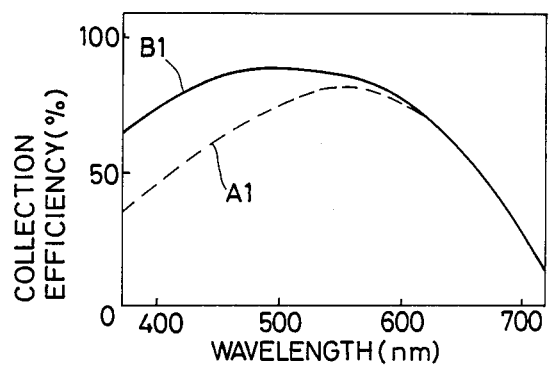
FIG. 4 shows inherent collection efficiency in relation to wavelength in a photovoltaic cell of an embodiment of the present invention, in comparison with a conventional photovoltaic cell.

FIG. 4 shows inherent collection efficiency of a photovoltaic cell in accordance with the present invention in relation to the light wavelength, compared with a conventional cell. It will be understood from FIG. 4 that the collection efficiency of a photovoltaic cell of this invention shown by the solid curved line B1 is remarkably improved in the short wavelength region as compared with that of a conventional cell shown by the broken line A1.

Figure 5:
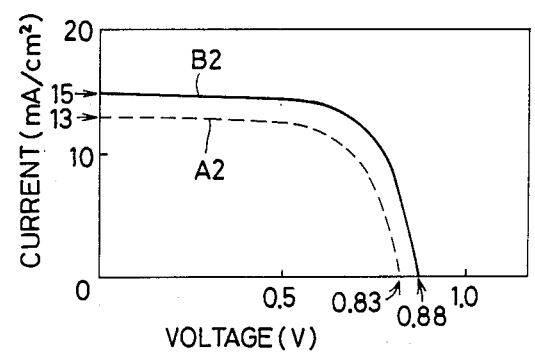
FIG. 5 shows characteristics of output current and output voltage of a photovoltaic cell in accordance with the present invention, compared with a conventional cell.

In FIG. 5, the solid curved line B2 representing the output voltage and current characteristics of a photovoltaic cell of this invention is shown in comparison with the broken line A2 representing those of a conventional cell. As seen from FIG. 5, the open-circuit voltage and the short-circuit current of a photovoltaic cell of this invention are both improved as compared with the conventional cell. The photovoltaic cell selected as the conventional cell for comparison in FIGS. 4 and 5 comprises amorphous silicon carbide layer of 20 Å in thickness having window effect, formed by plasma decomposition, instead of the P-type semiconductor layers 13 and 14 in a cell of this invention. The other portions of this conventional cell are the same as in a cell of this invention. Table 3 shows an example of plasma reaction conditions for formation of such amorphous silicon carbide layer.

TABLE 3

| Plasma Reaction Conditions for a-SiC | |
|---|---|
| main gas | SiH$_4$ (20 SCCM) |
| | CH$_4$ (15 SCCM) |
| doping gas | B$_2$H$_6$ (0.3%) |
| vacuum state | 0.2 Torr |
| temperature of substrate | 250° C. |
| RF power | 20 W |

TABLE 3-continued

| Plasma Reaction Conditions for a-SiC | |
|---|---|
| radio-frequency | 13.56 MHz |

Now, FIGS. 6 to 9 show the results of various experiments as to the influences exerted on the photoelectric conversion efficiency by the film thickness and the activation energy of holes in the P-type first and second semiconductor layers 13 and 14. Assuming that the conversion efficiency of a conventional cell is 8%, the film thickness and the activation energy in the semiconductor layers 13 and 14 in the range achieving conversion efficiency higher than this reference value are considered to fulfill the object of the present invention.

Table 4 shows optimum conditions in a photovoltaic cell of this invention, established as a result of these experiments.

TABLE 4

| Most Preferable Embodiment | | | |
|---|---|---|---|
| | material | thickness (Å) | activation energy |
| substrate | glass | — | — |
| transparent electrode film | SnO$_2$ | 300 | — |
| 1st semiconductor layer | (P) μc-Si | 70 | 0.03 eV |
| 2nd semiconductor layer | (P) a-Si | 500 | 0.70 eV |
| 3rd semiconductor layer | (I) a-Si | 6000 | — |
| 4th semiconductor layer | (N) μc-Si | 400 | — |
| back surface electrode film | Al | 5000 | — |

Figure 6:
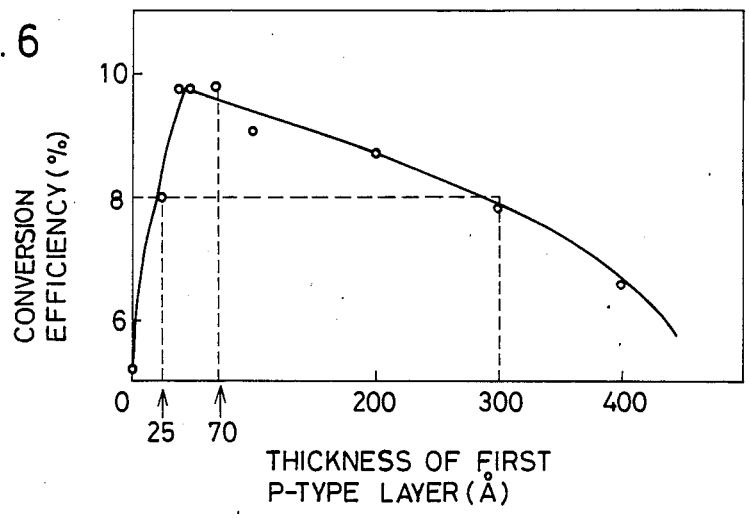
FIG. 6 shows photoelectric conversion efficiency dependent on the thickness of the first semiconductor layer of P type in a photovoltaic cell in accordance with the present invention.
Figure 7:
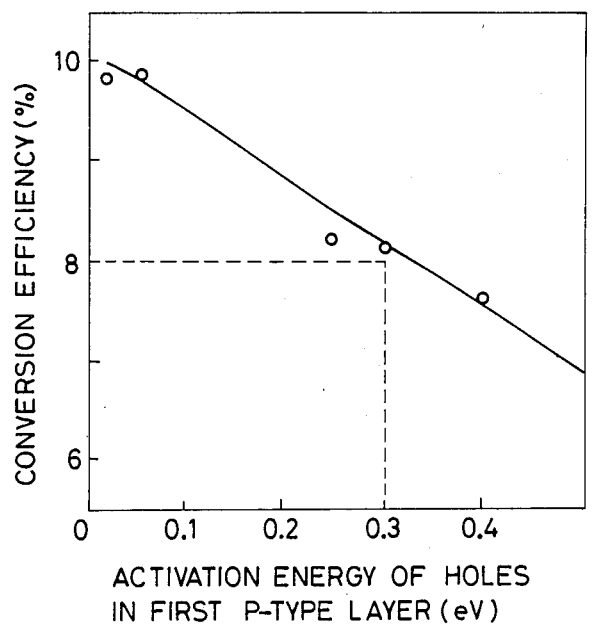
FIG. 7 shows conversion efficiency dependent on the activation energy of holes in the first semiconductor layer of P type in a photovoltaic cell in accordance with the present invention.

In determining to the relation between the thickness and the conversion efficiency of the first semiconductor layer 13 as in FIG. 6, the optimum values in Table 4 are used as the parameters other than the thickness of the layer 13. As seen in the figure, it is made clear that the conversion efficiency can be improved by the first semiconductor layer having a thickness in the range of 25 to 300 Å, compared with that of a conventional cell. FIG. 7 shows the relation between the activation energy $E_f - E_{vp1}$ in the first semiconductor layer 13 and the conversion efficiency. In the same manner as in the case of FIG. 6, the optimum values are used as the parameters other than the activation energy. It can be seen from FIG. 7 that the conversion efficiency can be improved by the first semiconductor layer 13 having activation energy of less than 0.3 eV.

Figure 8:
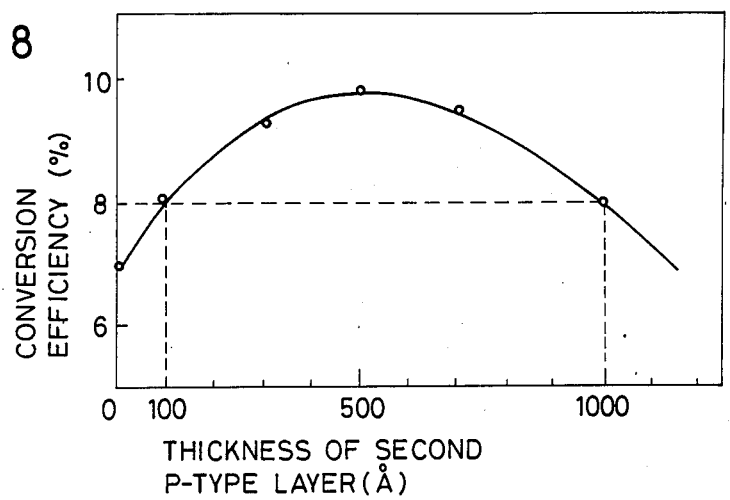
FIG. 8 shows conversion efficiency dependent on the thickness of the second semiconductor layer of P type in a photovoltaic cell in accordance with the present invention.
Figure 9:
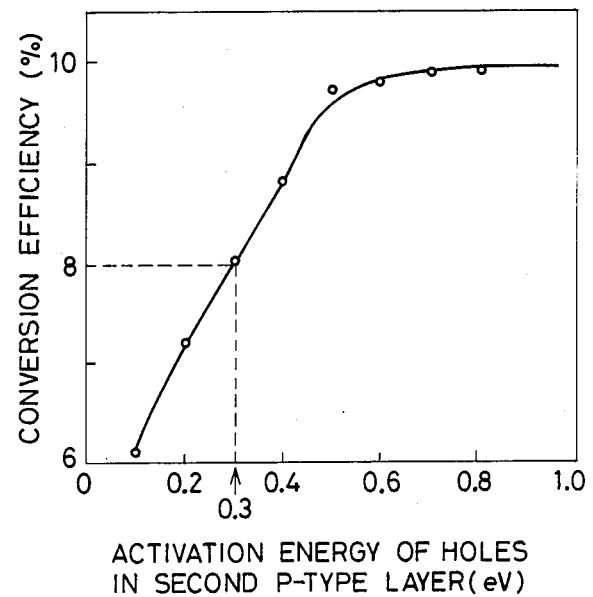
FIG. 9 shows conversion efficiency dependent on the activation energy of holes in the second semiconductor layer of P type in a photovoltaic cell in accordance with the present invention.

FIG. 8 shows the relation between the thickness of the second semiconductor 14 and the conversion efficiency, the other parameters being selected to be the optimum values. From this figure, it is understood that the conversion efficiency can be improved by the second semiconductor layer 14 having a thickness of 100 to 1000 Å. FIG. 9 shows the relation between the activation energy $E_f - E_{vp2}$ in the second semiconductor layer 14 and the conversion efficiency, where an improvement of the conversion efficiency can be seen in the activation energy of more than 0.3 eV.

Figure 10:
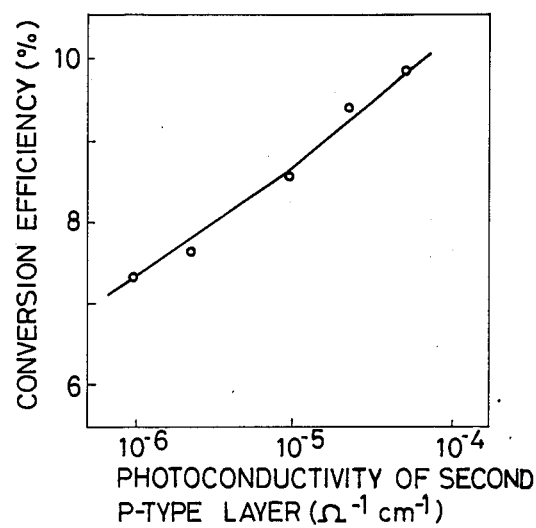
FIG. 10 shows conversion efficiency dependent on the photoconductivity of the second semiconductor layer of P type in a photovoltaic cell in accordance with the present invention.

FIG. 10 shows the relation between the photoconductivity of the second semiconductor layer 14 and the conversion efficiency in the case of irradiation of AM-1 light with 100 mW/cm$^2$. This range of photoconductivity corresponds to the photoconductivity in the vicinity of the composition ratio of main gas and doping gas in Table 2. From FIG. 10, it can be seen that the conversion efficiency is improved by the second semiconductor layer 14 having photoconductivity of more than $10^{-5}\Omega^{-1}cm^{-1}$. Even with such low photoconductivity as $10^{-6}\Omega^{-1}cm^{-1}$, the conversion efficiency is not abruptly decreased and the efficiency of at least 7% is obtained.

Figure 11A:
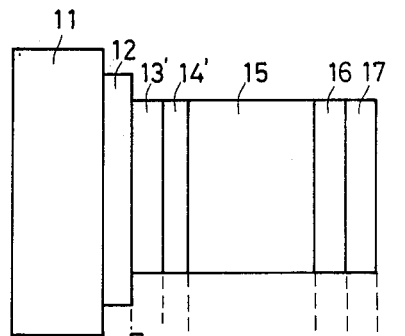
FIG. 11A shows schematically a sectional structure of a photovoltaic cell in accordance with another embodiment of the present invention.
Figure 11B:
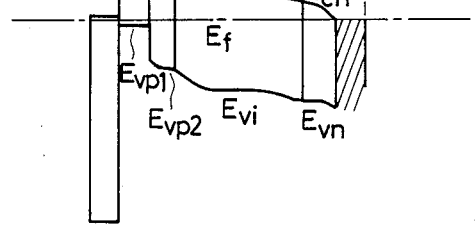
FIG. 11B is a schematic illustration explaining an energy band profile of the photovoltaic cell shown in FIG. 11A.

FIG. 11A shows a photovoltaic cell in accordance with another embodiment of the present invention. In this cell, the first semiconductor layer 13' of P type is an oxide of platinum group metal and the second semiconductor layer 14' of the same type is amorphous silicon carbide. The other portions or the layer 11, 12, 15, 16 and 17 are the same as those in FIG. 2. FIG. 11B shows schematically an energy band profile corresponding to the cell shown in FIG. 11A.

The platinum group metals include ruthenium Ru, rhodium Rh, palladium Pa, osmium Os, iridium Ir and platinum Pt. Although these metals are generally not easily oxidized, oxides of such as iridium, ruthenium and the like are obtained by sputtering in the atmosphere of oxygen. For example, by sputtering of iridium in the atmosphere of oxygen with the conditions of the temperature of the substrate of 15° C., the RF power of 0.1 W/cm$^2$ and the gas pressure of 0.1 Torr, iridium oxide is formed on the substrate with the growth rate of approximately 5 Å per minute. This iridium oxide, though not doped with P type impurity, exhibits characteristics of a p-type semiconductor. More specifically, the iridium oxide has activation energy $E_f - E_{vp1}$ of less than 0.03 eV, an optical band gap of approximately 4 eV and conductivity of more than $1\Omega^{-1}cm^{-1}$ at the room temperature.

On the other hand, the amorphous silicon carbide layer 14' is obtained by a plasma CVD method with silane gas containing a very small amount of P-type impurity gas and methane gas containing a carbon element. The P-type amorphous silicon carbide layer 14' is desirable to moderate the abrupt change from the large optical band gap of the oxide layer 13' to the optical band gap of the I-type amorphous silicon layer 15. Accordingly, the optical band gap of the layer 14' preferably changes so as to be large on the side adjacent to the layer 13' and to be small on the side adjacent to the layer 15. For example, in connection with the oxide layer 13' having an optical band gap of approximately 4 eV and the layer 15 having a band gap of approximately 1.7 eV, the layer 14' is formed to have an optical gap decreasing continually or by steps from approximately 2.0 eV on the side adjacent to the layer 13' to approximately 1.7 eV on the side adjacent to the layer 15. Such decrease of the band gap can be obtained by a plasma CVD method in which the flow rate of methane gas is decreased continually or by steps. For example, an optical band gap of approximately 2.0 eV is obtained by CVD gas containing SiH$_4$ of 70% and CH$_4$ of 30% and the value of the optical band gap can be decreased to approximately 1.7 eV by gradually decreasing the CH$_4$ gas to 0%.

The object of the present invention can also be attained by using ruthenium oxide instead of iridium oxide as the layer 13'. In the case of ruthenium oxide, the photoconductivity is further improved, while the loss of light due to absorption is slightly increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic cell comprising:
    a transparent substrate,
    a transparent first electrode layer on said substrate,
    a first semiconductor layer of a first conductivity type on said first electrode layer, said first semiconductor layer being approximately 25 to 300 Å in thickness and having activation energy of less than 0.3 eV for generation of major carriers,
    a second semiconductor layer of the first conductivity type on said first semiconductor layer, said second semiconductor layer being approximately 100 to 1000 Å in thickness and having activation energy of more than 0.3 eV for generation of major carriers,
    a third semiconductor layer of a second conductivity type on said second semiconductor layer,
    a fourth semiconductor layer of a third conductivity type on said third semiconductor layer, and
    a second electrode layer on said fourth semiconductor layer.

2. A photovoltaic cell as set forth in claim 1, wherein said first, second and third conductivity types are respectively P, I and N types.

3. A photovoltaic cell as set forth in claim 2, wherein said third semiconductor layer is made of amorphous silicon of I type.

4. A photovoltaic cell as set forth in claim 3, wherein said second semiconductor layer is an amorphous semiconductor having photoconductivity of more than $10^{-5}\Omega^{-1}cm^{-1}$ with irradiation of the optical spectrum (AM-1) on the equator with an intensity of 100 mW/cm$^2$.

5. A photovoltaic cell as set forth in claim 4, wherein said first semiconductor layer comprises microcrystalline silicon of P type.

6. A photovoltaic cell as set forth in claim 5, wherein said microcrystalline silicon layer is formed by sputtering.

7. A photovoltaic cell as set forth in claim 3, wherein said first semiconductor layer is oxide of a platinum group metal.

8. A photovoltaic cell as set forth in claim 7, wherein said oxide is iridium oxide.

9. A photovoltaic cell as set forth in claim 8, wherein said second semiconductor layer is made of amorphous silicon carbide.

10. A photovoltaic cell as set forth in claim 9, wherein carbon content in said amorphous silicon carbide layer is decreased from the side adjacent to said first semiconductor layer to the side adjacent to said second semiconductor layer and the optical band gap of said amorphous silicon carbide layer decreases according to said decrease of the carbon content.

11. A photovoltaic cell as set forth in claim 1, wherein the thickness of said first semiconductor layer is preferably 30 to 200 Å.

12. A photovoltaic cell as set forth in claim 1, wherein the thickness of said first semiconductor layer is more preferably 40 to 150 Å.

13. A photovoltaic cell as set forth in claim 1, wherein the thickness of said second semiconductor layer is preferably 300 to 700 Å.

14. A photovoltaic cell as set forth in claim 1, wherein the thickness of said second semiconductor layer is more preferably 400 to 600 Å.

15. A photovoltaic cell as set forth in claim 1, wherein said first, second and third semiconductors are respectively N, I and P types.

16. A photovoltaic cell as set forth in claim 15, wherein said third semiconductor is amorphous silicon of I type.

17. A photovoltaic cell as set forth in claim 16, wherein said first semiconductor layer comprises microcrystalline silicon of N type.

18. A photovoltaic cell as set forth in claim 17, wherein said microcrystalline silicon layer is formed by sputtering.

* * * * *